INVENTOR
M. M. ATALLA
BY H W Lockhart
ATTORNEY

United States Patent Office 3,121,809

Patented Feb. 18, 1964

3,121,809

SEMICONDUCTOR DEVICE UTILIZING MAJORITY CARRIERS WITH THIN METAL BASE BETWEEN SEMICONDUCTOR MATERIALS

Martin M. Atalla, Menlo Park, Calif., assignor to Bell Telephone Laboratories, Incorporated, New York, N.Y., a corporation of New York Filed Sept. 25, 1961, Ser. No. 140,533
13 Claims. (Cl. 307—88.5)

This invention relates to semiconductor devices. More particularly, this invention relates to semiconductor devices in which a metal layer serves as an active portion.

A typical semiconductor device, for example, a junction transistor, includes a monocrystalline semiconductor wafer which comprises a first region of one conductivity type intermediate second and third regions of the opposite conductivity type and defining therewith separate emitting and collecting PN junctions. The intermediate region of the junction transistor is termed the base, the others, the emitter and the collector.

In an effort to enhance the performance of a junction transistor, the base generally is made thin, that is, the distance between the emitting and collecting PN junctions is made small for increasing the collection efficiency of charge carriers injected into the base and minimizing the time required for these carriers to traverse the base. However, there are practical limits to how thin the base can be made reliably, and so limits to the efficiency and frequency response that can be realized reliably.

Among the various forms of junction transistors which have been employed is the surface barrier type, in which the emitting and collecting junctions are formed by large area metallic electrodes of appropriate material contacting a semiconductor wafer homogeneous in conductivity type. However, such surface barrier transistors have not been particularly efficient and the trend has been to provide some alloying of the electrode material with the semiconductive material to introduce the emitter and the collector deeper into the wafer. This, however, tends to create new problems.

The present invention represents a departure from this approach.

This invention in one aspect stems from an appreciation that the efficiency of the injection of minority carriers into a semiconductor from a metal-semiconductor barrier is marginal because most of the current flowing across such barrier is carried by majority carriers flowing from the semiconductor into the metal. It is recognized now that these majority carriers when injected into the metal are relatively energetic and are commonly referred to as hot electrons. To utilize this phenomenon, a transistor in accordance with the present invention comprises a thin base of metal between an emitter and a collector of semiconductor material. In this new structure "hot" majority carriers are injected into the metallic base from the semiconductor emitter for collection by the semiconductor collector. In this connection the term "hot" refers to energies in excess of the Fermi level electron energy in the metal.

Therefore, a feature of this invention is a transistor including a metallic base bounded by an emitter and a collector of semiconductor material for forming emitting and collecting metal-semiconductor barriers.

A major advantage of this device stems from the fact that the injected charge carriers are majority carriers and, accordingly, the frequency limiting effect of minority carrier storage is vitiated.

In one embodiment of the invention a thin layer of gold is sandwiched between two silicion wafers of N conductivity type, each including a surface layer which is degenerate at least where ohmic contact is made to it. An additional electrode is connected to the gold layer.

Further objects and features will be understood more fully from the following drawing wherein.

It is to be understood that the figures are not necessarily to scale, certain dimensions being exaggerated for illustrative purposes.

Figure 1:
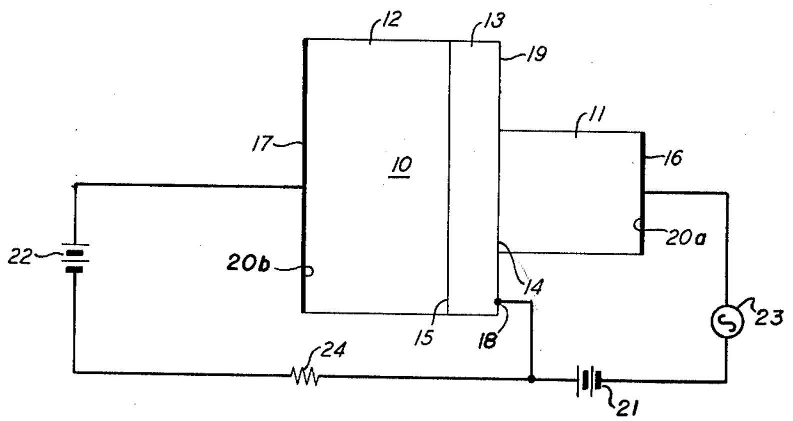
FIG. 1 is a schematic representation of a device in accordance with this invention.

With reference specifically to FIG. 1, transistor 10 comprises an emitter 11 and a collector 12 of like conductivity type material. Between regions 11 and 12 is a thin base 13 composed of a metal and forming at the interfaces 14 and 15 metal-semiconductor rectifying barriers. Electrical contact to the regions 11 and 12 is provided by the metallic contacts 16 and 17. Contact to the thin base 13 is made by a metallic contact 18 connected to a portion 19 of enlarged lateral dimensions.

Typically, the emitter 11 and collector 12 are of N-type conductivity silicon and the base 13 is of a suitable metal such as gold. Advantageously, the surfaces 20*a* and 20*b*, respectively, of the emitter and collector contacted by electrodes 16 and 17 are degenerate, including a concentration of an N-type conductivity impurity in excess of $5\times10^{19}$ atoms per cubic centimeter and the regions contiguous to the metal layer non-degenerate, having an impurity concentration less than $10^{19}$ atoms per cubic centimeter. The device, then, typically has the configuration $N^+$-N-metal-N-$N^+$, the $N^+$ symbol designating the degenerate surface portions.

In one specific embodiment of this invention base 13 is a gold layer about 100 Angstrom units thick and layers 11 and 12 are each of N-type silicon and approximately .010 inch thick. The layers are provided with low resistivity surface portions to which electrode connections 16 and 17 are made. The lateral dimensions of layer 11 are about .015 and those of layers 12 and 13 about .030 inch square. Such a structure is susceptible of fabrication by known techniques.

One method for fabricating this embodiment is as follows. The starting material (which ultimately can be divided into twenty .030 inch diameter devices) is a crystal of silicon having dimensions approximately .25 inch square and .010 inch thick and including an impurity concentration of $10^{20}$ atoms of phosphorous per cubic centimeter. An N-type epitaxial layer about .0002 inch thick and with a resistivity of about one ohm-centimeter is formed over one face of the crystal. The crystal subsequently is cleaned by well known successive boiling and rinsing steps. A low resistance gold-antimony layer which is to serve as the collector electrode is evaporated over the other face of the crystal. Then .030 inch diameter gold dots approximately 100–200 Angstrom units thick are evaporated on the epitaxial layer. A second crystal, the same as the starting material, also provided with an N-type conductivity epitaxially grown film as above is cleaned and subsequently cut by ultrasonic sawing techniques into .015 inch squares after a low resistance electrode 16 is provided to the back side of the crystal. A square from the second crystal is positioned in intimate contact with a portion of a gold dot and a gold point contact (18) is pressure connected to the remaining portion of the gold dot.

In operation, a voltage source 21 is connected between contacts 16 and 18 poled to forward bias barrier 14, and a voltage source 22 is connected between contacts 17 and 18 poled to reverse bias barrier 15. Hot majority carriers whose number is controlled by a signal source 23 connected serially with the bias voltage source 21 are emitted from region 11 into the metallic base region 13. While each carrier expends some energy traversing the base region, if their initial energy is suitably high, many carriers remain sufficiently energetic to overcome the collecting barrier, setting up a current flow in the output circuit including load 24.

Figure 2A:
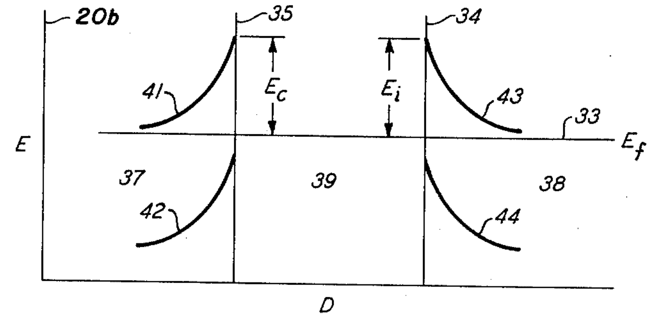
FIG. 2A is an energy diagram representative of the device of FIG. 1 under equilibrium conditions.

The principles of operation of the device can be understood with reference to the energy diagram of FIG. 2A.

More specifically, it will be helpful to consider the device of FIG. 1 as superimposed on a graph, the abscissa of which is distance across the device from surface 20*b* and the ordinate is electron energy. In this graph, line 33 denotes the "Fermi level" and represents the energy level which has a fifty percent probability of being filled by charge carriers. The Fermi level is level throughout the device under equilibrium conditions. Lines 34 and 35, respectively, correspond to the metal-semiconductor barriers 14 and 15. Regions 37, 38 and 39 correspond to regions 12, 11 and 13, respectively.

Typically, when a semiconductor material and a metal are brought in contact, the difference in the surface work function between the two results in a potential change at the interface. This potential change is depicted at line (or barrier) 35 by the sharp rise in the slope of curves 41 and 42 which represent the bottom of the conduction band and the top of the valence band respectively of the semiconductor material and define therebetween the energy gap characteristic of the semiconductor material. A similar representation is associated with the line 34 where curves 43 and 44 correspond to curves 41 and 42.

Figure 2B:
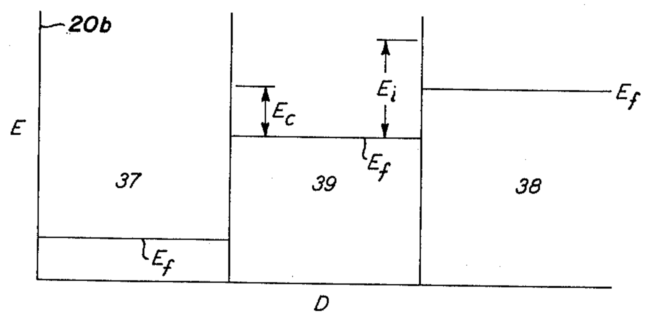
FIG. 2B is a partial energy diagram representative of the device of FIG. 1 under bias conditions.

Under equilibrium conditions few charge carriers are injected into the base. However, in response to a forward bias voltage, barrier 14 injects majority carriers, electrons for N-type conductivity material, into the metal base. In response to a reverse bias voltage, the collection energy $E_c$ of barrier 15 is sufficiently reduced to enable collection of these electrons. The relative decrease in $E_c$ with respect to the injection energy $E_i$ under bias conditions is illustrated in FIG. 2B. The injection energy of these injected electrons needs to exceed the collection energy at least by an amount equal to the energy expanded while traversing region 39 for transistor action to result.

In general, the frequency capabilities and the gain of a transistor determine its usefulness. As is the case with prior art devices, the emitter and collector capacitances and series resistances, the base resistance, the transit time of carriers through the base and minority carrier storage time determine the maximum frequency response of the device. In accordance with this invention, higher frequency responses are achieved primarily by using a low resistance metal base and by minimizing the number of minority carriers present. Moreover, an additional benefit is gained by turning to account the relatively short transit time of majority carriers through the base. Additionally, the emitter capacitance is susceptible of further reduction by employing adjacent the base semiconductive material having a resistivity higher than the semiconductive material suitable in prior art devices.

In particular, for efficient performance the portion of the emitter contiguous the base should have an impurity concentration sufficiently low to avoid tunneling of charge carriers into the base. For an N-type silicon emitter, the upper limit to the impurity concentration in this portion is $5\times10^{18}$ atoms per cubic centimeter. The lower limit on the impurity concentration in this portion is determined by the acceptable level of minority carrier injection from the base into the emitter. For an N-type silicon emitter a lower limit of about $5\times10^{14}$ atoms per cubic centimeter or a resistivity as high as ten ohm-centimeters is necessary for avoiding an appreciable flow of holes from the metal into the semiconductor with a corresponding loss in collection efficiency. For maximum frequency response the base thickness advantageously is less than the mean free path (in the base material) of an injected charge carrier.

The transconductance, the efficiency of hot electron emission and the percentage of emitted electrons collected determine the gain. The dependence of emitter current on voltage for a semiconductor-metal barrier is particularly advantageous for obtaining the high transconductance necessary for high gain performance. One expedient for further increasing the gain of a device in accordance with this invention is to decrease the thickness of the base. Another expedient for increasing the gain is to increase the energy at which the hot electrons are injected with respect to the collection energy. This expedient requires careful selection of metals and semiconductors with compatible work functions.

The selection of materials is subject only to the requirement that they provide sufficient energy to the injected electrons for enabling collection. Accordingly, the emitter and collector need not be of the same semiconductor material. For example, with a base of gold, the emitter and collectors may have the following composition:

| Emitter | Base | Collector |
|---|---|---|
| Si (Silicon) | Au (Gold) | Si, Ge (Germanium). |
| GaAs (Gallium Arsenide) | Au (Gold) | GaAs, Si, Ge. |
| GaP (Gallium Phosphide) | Au (Gold) | GaP, GaAs, Si, Ge. |
| CdS (Cadmium Sulphide) | Au (Gold) | CdS, GaP, GaAs, Si, Ge. |

In each case the width of the metal base is made sufficiently thin for conserving the energy expended while an electron traverses the base. In other words, the base is made sufficiently thin that the energy expended while an electron traverses it plus the collection energy is less than the injection energy. This is to insure that the injected electron will have sufficient energy to traverse the base and overcome the collecting barrier. Accordingly, other metals such as silver, copper, platinum, tungsten, chromium and nickel can be used in the base if the base thickness is adjusted appropriately. The semi-metal bismuth which because of the long mean free path of a hot charge carrier through it allows for a base thickness of several thousand Angstrom units also may be used to advantage. Alternatively, successive layers of more than one metal can be used advantageously in the base to provide a minimum energy requirement in traversing the base. For example, a composite base of gold and aluminum, with gold contacting the emitter and aluminum the collector, is particularly advantageous since the aluminum-semiconductor collector barrier is substantially less energetic than the gold-semiconductor emitter barrier. Those charge carriers insufficiently energetic to successfully traverse the base degenerate to lower energy states by radiative transitions in the infrared range.

Basic to this invention is the successful use of a semiconductor-metal barrier for emitting majority carriers. The use of such a barrier is not limited to transistors but is applicable to any device involving emission of energetic electrons, such as a vacuum tube. When the emitted electrons are to be injected into a vacuum as a vacuum tube, it is advantageous to provide a coating of a work-function reducing material, such as cesium, on the portion of the metal surface where emission is to occur.

No effort has been made to describe all possible embodiments of the invention. It should be understood that the various aspects and embodiments described are merely illustrative of the various forms of the invention and various modifications may be made therein without departing from the spirit and scope of the invention.

For example, although the invention has been disclosed in cooperation with a common-base circuit arrangement, it is within the purview of one skilled in the art to extend the operation of the invention to other circuit arrangements such as common-emitter or common-collector.

Further, although the invention has been disclosed in terms of an N-metal-N structure, it is to be understood that the P-metal-P structure also is contemplated.

Moreover, it should be appreciated that the structure described may be confined to a portion of a semiconductor wafer for forming more complicated structures.

What is claimed is:

1. In combination, a device including first and third layers spaced apart by a second layer, said first and third layers comprising semiconductor material of like conductivity type, said second layer comprising metallic material for forming first and second rectifying barriers with said first and third layers respectively, separate low resistance contacts to each of said layers, means for forward biasing said first rectifying barrier for injecting charge carriers into said second layer, means for reverse biasing said second barrier for collecting the charge carriers, and a signal means for controlling the flow of said charge carriers, said second layer being sufficiently thin to enable the collection of the injected charge carriers.

2. A signal translating device comprising a continuous metallic layer having a thickness of less than about the length of a mean free path of a charge carrier in said layer intermediate between a first and second layer of semiconductor material of like conductivity type, and a separate low resistance contact to each of the three layers.

3. A signal translating device in accordance with claim 2 wherein said intermediate layer has a thickness less than the length of a mean free path of a charge carrier in said layer.

4. A signal translating device in accordance with claim 2 wherein said intermediate layer comprises a layer of gold about 100 Angstrom units thick.

5. A signal translating device in accordance with claim 2 wherein said intermediate layer comprises two distinct layers of first and second metals.

6. A signal translating device in accordance with claim 2 wherein said first and second layers of semiconductor material are of the same semiconductor material.

7. A signal translating device in accordance with claim 2 wherein said first layer of semiconductor material is a first semiconductor material and said second layer of semiconductor material is a different second semiconductor material.

8. A signal translating device in accordance with claim 2 wherein said first layer of semiconductor material is silicon, said metallic layer is gold and said second layer of semiconductor material is silicon.

9. A signal translating device in accordance with claim 2 wherein said first layer of semiconductor material is silicon, said metallic layer is gold and said second layer of semiconductor material is germanium.

10. A signal translating device in accordance with claim 2 wherein said first layer of semiconductor material comprises cadmium sulphide, said metallic layer comprises gold and said second layer of semiconductor material comprises a material selected from the class consisting of cadmium sulphide, gallium phosphide, gallium arenside, silicon and germanium.

11. A signal translating device in accordance with claim 2 wherein said first layer of semiconductor material comprises gallium phosphide, said metallic layer comprises gold and said second layer of semiconductor material comprises a material selected from the class consisting of gallium phosphide, gallium arsenide, silicon and germanium.

12. A signal translating device in accordance with claim 2 wherein said first layer of semiconductor material comprises gallium arsenide, said metallic layer comprises gold and said second layer of semiconductor material comprises a material selected from the class consisting of gallium arsenide, silicon and germanium.

13. A signal translating device comprising a semiconductor layer in intimate contact with a metallic layer and forming therebetween a metal-semiconductor barrier, said metallic layer being of a thickness of less than about a mean free path of a charge carrier therein to permit the passage therethrough of the carriers which are in the majority in the region of the semiconductor contiguous thereto, and means adjacent said metallic layer for collecting the majority carriers which successfully traverse the metallic layer, the metallic layer being free of any openings permitting the direct passage of carriers between the semiconductor layer and the collecting means.

References Cited in the file of this patent

UNITED STATES PATENTS

| | | |
|---|---|---|
| 1,877,140 | Lilienfeld | Sept. 13, 1932 |
| 2,720,573 | Lundqvist | Oct. 11, 1955 |
| 2,836,776 | Ishikawa et al. | May 27, 1958 |
| 3,011,075 | Tomlinson | Nov. 28, 1961 |

Notice of Adverse Decision in Interference

In Interference No. 94,286 involving Patent No. 3,121,809, M. M. Atalla, SEMICONDUCTOR DEVICE UTILIZING MAJORITY CARRIERS WITH THIN METAL BASE BETWEEN SEMICONDUCTOR MATERIALS, final judgment adverse to the patentee was rendered July 22, 1965, as to claims 1, 2, 3, 4, 6, 7 and 13.

[*Official Gazette September 28, 1965.*]